US009338909B2

(12) United States Patent
Tanaka (10) Patent No.: US 9,338,909 B2
(45) Date of Patent: May 10, 2016

(54) WATERPROOF STRUCTURE, ELECTRONIC DEVICE, AND METHOD FOR MANUFACTURING THE WATERPROOF STRUCTURE

(75) Inventor: Motoyuki Tanaka, Kanagawa (JP)

(73) Assignee: NEC CORPORATION, Tokyo (JP)

(*) Notice: Subject to any disclaimer, the term of this patent is extended or adjusted under 35 U.S.C. 154(b) by 357 days.

(21) Appl. No.: 13/981,638

(22) PCT Filed: Nov. 2, 2011

(86) PCT No.: PCT/JP2011/075318
§ 371 (c)(1),
(2), (4) Date: Jul. 25, 2013

(87) PCT Pub. No.: WO2012/120727
PCT Pub. Date: Sep. 13, 2012

(65) Prior Publication Data
US 2013/0314863 A1 Nov. 28, 2013

(30) Foreign Application Priority Data
Mar. 4, 2011 (JP) .................................. 2011-047738

(51) Int. Cl.
*H05K 5/06* (2006.01)
*H04M 1/18* (2006.01)
(Continued)

(52) U.S. Cl.
CPC ................ *H05K 5/06* (2013.01); *G06F 1/1656* (2013.01); *H04M 1/18* (2013.01); *H05K 5/0017* (2013.01); *H05K 13/00* (2013.01); *Y10T 29/49826* (2015.01)

(58) Field of Classification Search
CPC ... G06F 1/1628; G06F 1/1626; G06F 1/1656; G06F 2200/1633; G06F 1/1616; G06F 1/1624; G06F 1/16; G06F 1/1613; G06F 1/1601; G06F 1/1643; G06F 1/1684; H05K 5/0217; H05K 13/00; H05K 5/0004; H05K 5/0017; H05K 5/0086; H05K 5/0239; H05K 5/03; H05K 5/06; H05K 5/061; H05K 5/068; Y10T 29/49826; H04M 1/18

USPC ............ 361/679.01, 679.02, 679.55–679.58, 361/679.09, 679.21, 679.22, 679.26, 361/679.27; 312/223.1–223.2; 29/428
See application file for complete search history.

(56) References Cited

U.S. PATENT DOCUMENTS

| 7,692,732 B2 | 4/2010 | Tsubokura et al. |
| 8,054,400 B2 | 11/2011 | Tsubokura et al. |

(Continued)

FOREIGN PATENT DOCUMENTS

| CN | 101017710 | 8/2007 |
| CN | 101420643 | 4/2009 |

(Continued)

OTHER PUBLICATIONS

CN Office Action dated May 27, 2015, with English Translation; Application No. 201180068975.2.
Extended European search report, dated Jan. 5, 2015, in corresponding European Patent Application No. 11860172.3.
(Continued)

*Primary Examiner* — Anthony Haughton
*Assistant Examiner* — Ingrid Wright
(74) *Attorney, Agent, or Firm* — Young & Thompson (57) ABSTRACT

The disclosed device includes: housing which has opening; protective panel arranged in the housing and which closes opening; O ring which is arranged on one face of protective panel in a direction perpendicular to an opening plane of opening; sliding plate which is arranged on the other face of protective panel in a direction perpendicular to the opening plane of opening and which holds protective panel in such a way that protective panel can slide in a direction parallel to the opening plane of opening; and spring member which is arranged in the state of making contact with an end portion of protective panel and which supports protective panel in such a way that protective panel can be displaced in a direction parallel to the opening plane of opening. Protective panel is supported by housing in the state in which protective panel is sandwiched between O ring and sliding plate.

20 Claims, 5 Drawing Sheets

(51) Int. Cl.
*G06F 1/16* (2006.01)
*H05K 5/00* (2006.01)
*H05K 13/00* (2006.01)

(56) References Cited

U.S. PATENT DOCUMENTS

| | | | |
|---|---|---|---|
| 8,259,930 B2 | 9/2012 | Kawasaki et al. | |
| 8,355,249 B2 * | 1/2013 | Ge | H04B 1/3888 220/345.1 |
| 8,548,159 B2 | 10/2013 | Kawasaki et al. | |
| 2005/0039995 A1 | 2/2005 | Inoke et al. | |
| 2009/0244853 A1 | 10/2009 | Takahashi | |

FOREIGN PATENT DOCUMENTS

| | | |
|---|---|---|
| JP | 58-78685 | 5/1983 |
| JP | 61-254884 | 11/1986 |
| JP | 11-298157 | 10/1999 |
| JP | 2001-345901 | 12/2001 |
| JP | 2002-081975 | 3/2002 |
| JP | 2005-333290 | 12/2005 |
| JP | 2005-340683 | 12/2005 |
| JP | 2009-239784 | 10/2009 |
| JP | 2009-265081 | 11/2009 |

OTHER PUBLICATIONS

International Search Report, PCT/JP2011/075318, Dec. 27, 2011.

* cited by examiner

WATERPROOF STRUCTURE, ELECTRONIC DEVICE, AND METHOD FOR MANUFACTURING THE WATERPROOF STRUCTURE

TECHNICAL FIELD

The present invention relates to a waterproof structure that is located at the opening of a casing of an electronic device, an electronic device having the waterproof structure, and a method for manufacturing the waterproof structure.

BACKGROUND ART

An electronic device such as a portable terminal having a display panel, generally, has a display panel arranged opposite to the opening of a housing and is constructed in such a way that the opening is closed by a protective panel. An electronic device like this has a waterproof structure in which the opening is hermetically closed by the protective panel. Constructions that are described in patent documents 1, 2, are example of this kind of waterproof structure that is publically known.

In recent years, in an electronic device having a touch panel for operating a display of a display panel, the display face of the display panel tends to be increased in size and the usage environment of a user is greatly changed as the size of the display face increases. For this reason, the cases where the electronic device gets wet or has an impact applied thereto have increased in number.

Further, as the size of the display face of the electronic device increases, the electronic device is limited by the kind of materials which can be combined for use in the electronic device according to the linear expansion coefficients of the materials of constituent members. Therefore, increasing the size of the display face of the electronic device makes it difficult to ensure adequate waterproof characteristics and durability. Hence, in the electronic device provided with a touch panel, in particular, are strongly requested improvements in the waterproof property and in the resistance to impact of the display face of the display panel.

Figure 1:
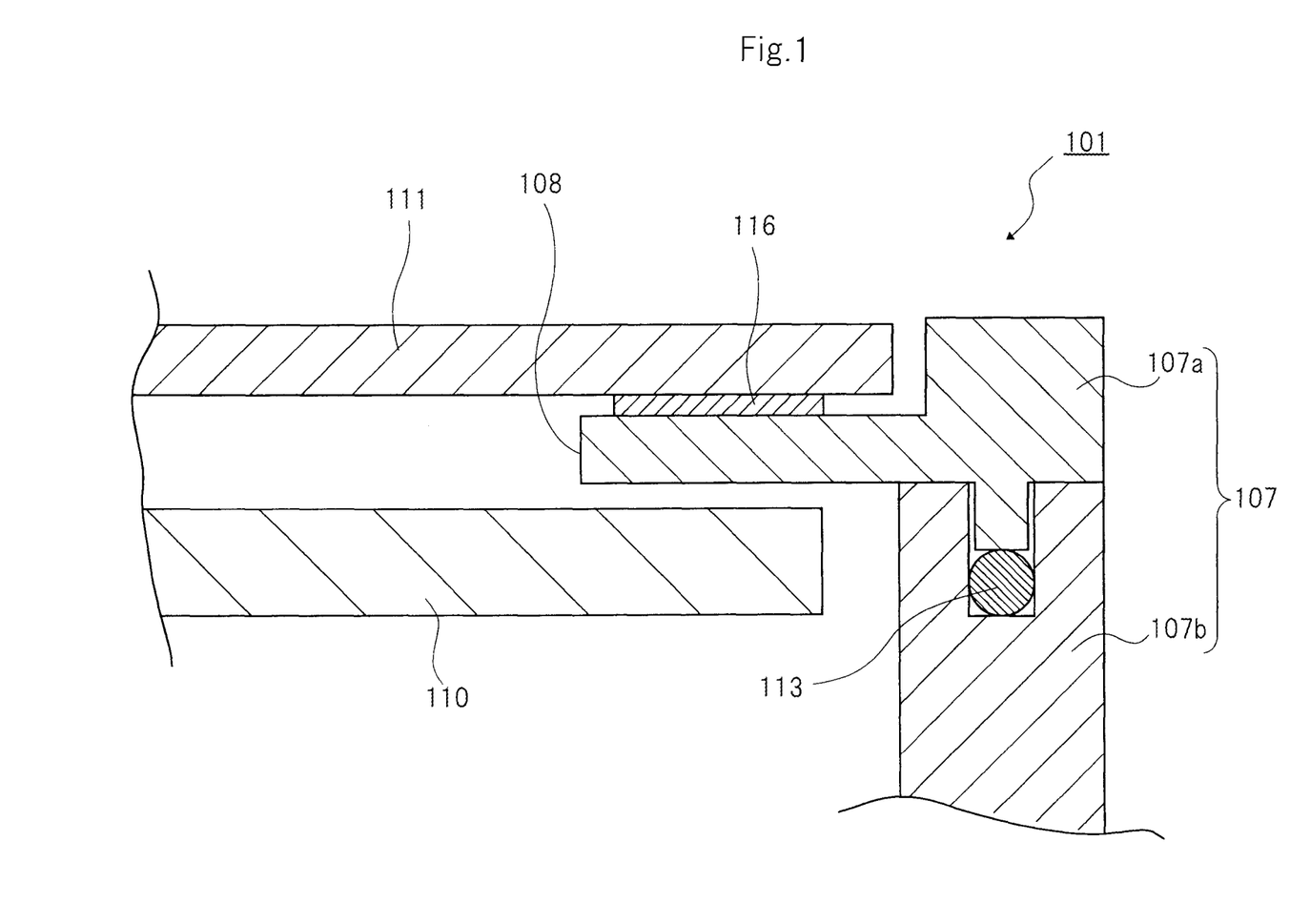
[FIG. 1] A section view showing a waterproof structure relating to the present invention.

A section view of an example of a waterproof structure relating to the present invention is shown in FIG. 1. As shown in FIG. 1, waterproof structure 101 relating to the present invention includes: a housing 107 having opening 108; liquid crystal display panel 110 which is arranged opposite to opening 108 in the housing 107; and protective panel 111 which is arranged outside housing 107 and which closes opening 108. Protective panel 111 is arranged in such a way as to protect the display face of liquid display panel 110.

Housing 107 is constructed of first outer case 107a and second outer case 107b which are engaged with each other. A portion in which first outer case 107a is engaged with second outer case 107b has O ring 113 fitted therein and hence has airtightness ensured. Protective panel 111 is arranged on the outer side of first outer case 107a and is bonded to the peripheral edge portion of opening 108 by double-sided adhesive tape 116 to thereby close opening 108.

Patent document 1: Japanese Utility Model Application Laid-Open No. 58-78685

Patent document 2: Japanese Patent Application Laid-Open No. 2005-333290

SUMMARY OF INVENTION

By the way, as described above, the waterproof structure relating to the present invention has the following problems.

The first problem is described as follows: respective constituent members are different from each other in a linear expansion coefficient and hence a change in temperature causes a change to the outside dimension of the protective panel and the housing, whereby the constituent members are shifted in position from each other in the state where different kinds of constituent members are fitted in and combined with each other. For this reason, in the case where the constituent members are greatly moved in position, an adhesive force of an adhesive member such as a double-sided adhesive tape cannot endure a force developed by the constituent member being moved in position and hence the adhesive member is broken, which presents the problem of impairing the waterproof property.

The second problem is described as follows: the protective panel is directly fixed to the opening of the housing by the adhesive member, so that the protective panel directly receives an impact applied thereto when the electronic device is dropped, thereby making it likely that the electronic device will break.

The third problem is described as follows: the protective panel in the waterproof structure described above is placed on the opening of the housing by the adhesive member, so that the center of an opposite face of the protective panel opposite to the liquid display panel is shifted from the center of the opening according to a variation in the position in which the protective panel is placed. As a result, the center of the display face of the liquid display panel is shifted from the center of the opposite face of the protective panel, which also presents the problem of causing faulty fabrication.

Hence, an object of the present invention is to provide a waterproof structure capable of solving any one of the relating technical problems described above and enhancing waterproof properties and enhancing resistance to impact, an electronic device having the waterproof structure, and a method for manufacturing the waterproof structure.

In order to achieve the object described above, a waterproof structure relating to the present invention includes: a housing which has an opening; a closing member which is arranged in the housing and which closes the opening; a waterproof member which is arranged on one face of the closing member in a direction perpendicular to an opening plane of the opening; a holding member which is arranged on the other face of the closing member in a direction perpendicular to the opening plane of the opening and which holds the closing member in such a way that the closing member can slide in a direction parallel to the opening plane of the opening; and an elastic member which is arranged such that it makes contact with an end portion of the closing member and which supports the closing member in such a way that the closing member can be displaced in a direction parallel to the opening plane of the opening. The closing member is supported by the housing in the state in which the closing member is sandwiched between the waterproof member and the holding member.

Further, an electronic device relating to the present invention includes a waterproof structure of the present invention.

Still further, a method for manufacturing a waterproof structure relating to the present invention includes the steps of: sandwiching a closing member, which is arranged in a housing and which closes an opening of the housing, between a waterproof member, which is arranged on one face of the closing member in a direction perpendicular to an opening plane of the opening, and a holding member, which is arranged on the other face of the closing member in a direction perpendicular to the opening plane of the opening; and holding the closing member by the holding member which made contact with an end portion of the closing member in such a way that the closing member can be displaced in a direction parallel to the opening plane of the opening.

According to the present invention, the closing member is movably supported by the holding member and the elastic member makes contact with the closing member, whereby waterproof properties can be enhanced and resistance to impact can be improved.

DESCRIPTION OF EMBODIMENTS

Hereinafter, specific embodiments of the present invention will be described with reference to the accompanying drawings.
(First Embodiment)

Figure 2:
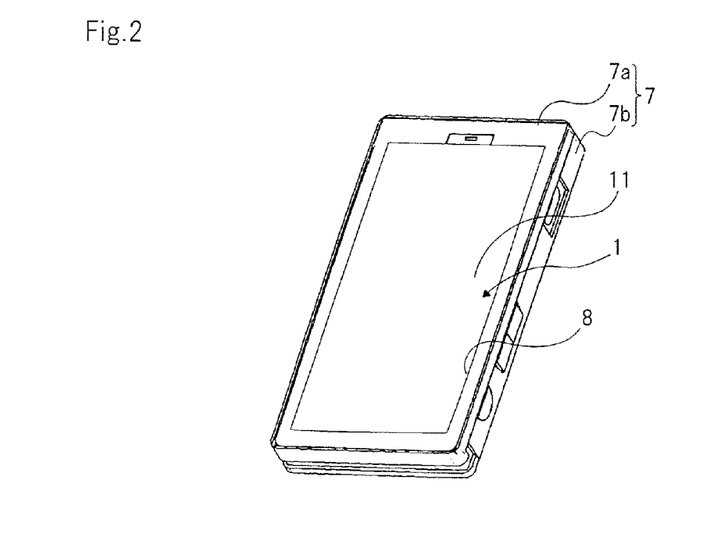
[FIG. 2] A perspective view showing an electronic device of a first embodiment.

A perspective view of an electronic device of a first embodiment is shown in FIG. 2. A section view to show a main portion of a waterproof structure that the electronic device of the first embodiment has, is shown in FIG. 3.

Figure 3:
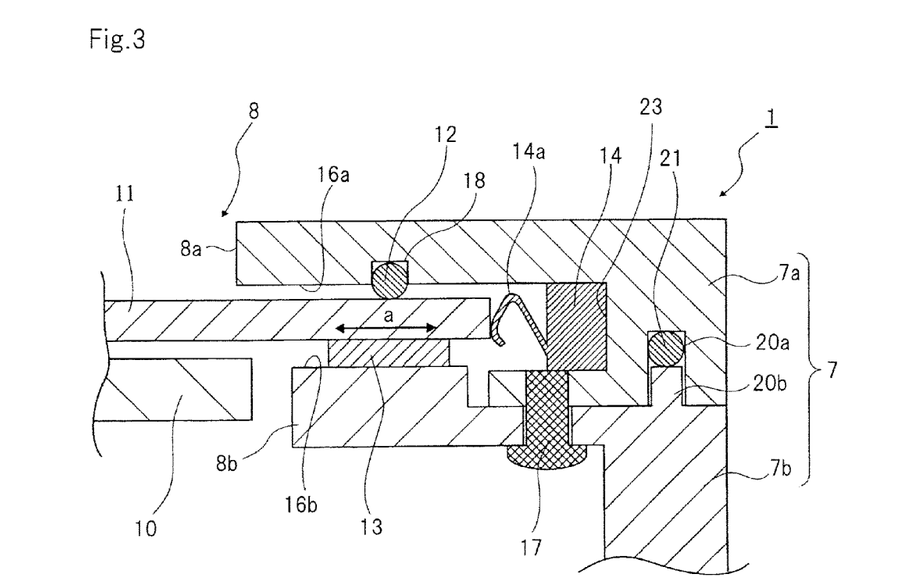
[FIG. 3] A section view showing a main portion of a waterproof structure that the electronic device of the first embodiment has.

As shown in FIG. 2 and FIG. 3, the electronic device of the first embodiment has waterproof structure 1 for preventing liquid from coming into housing 7 from the outside thereof As shown in FIG. 3, the waterproof structure 1 includes: housing 7 having opening 8; liquid crystal display panel 10 as a display element arranged opposite to opening 8 in housing 7; protective panel 11 arranged in housing 7 and functioning as a member for closing opening 8; O ring 12 arranged on one face of protective panel 11 in a direction perpendicular to an opening plane of opening 8 and functioning as a waterproof member; sliding plate 13 arranged on the other face of protective panel 11 in a direction perpendicular to the opening plane of opening 8 and functioning as a holding member for holding protective panel 11 slidably in a direction parallel to the opening plane of opening 8; and spring member 14 arranged such that it makes contact with an end portion in a direction parallel to the opening plane of opening 8 and functioning as an elastic member for supporting protective panel 11 in such a way that protective panel 11 can be displaced in a direction parallel to the opening plane of opening 8. Here, in the present invention, the opening plane of opening 8 designates an imaginary plane including a peripheral edge of opening 8.

Housing 7 includes: first outer case 7a arranged on an outer face side of protective panel 11 in a direction perpendicular to the opening plane of opening 8; and second outer case 7b arranged on an inner face side of protective panel 11 in a direction perpendicular to the opening plane of opening 8. First outer case 7a has opening 8a and has opposite face 16a formed in a peripheral edge portion of opening 8a, opposite face 16a being opposite to one face of protective panel 11. Second outer case 7b has opening 8b and has opposite face 16b formed in a peripheral edge portion of opening 8b, opposite face 16b being opposite to the other face of protective panel 11. Opening 8a of first outer case 7a is formed smaller than opening 8b of second outer case 7b.

First outer case 7a and second outer case 7b are fixed to each other by screw 17 in the state where opposite faces 16a, 16b are opposed to each other, and protective panel 11 is arranged between first outer case 7a and second outer case 7b.

Liquid crystal display panel 10 is disposed in opening 8b of second outer case 7b and is arranged in such a way that a display face of liquid crystal display panel 10 is opposite to protective panel 11. Here, the display element is not limited to the liquid crystal display panel but, of course, for example, an organic EL (electroluminescence) panel and other display panels can be employed as the display element.

Protective panel 11 is formed of a material having optical transparency in the shape of a flat plate and the display face of liquid crystal display panel 10 is visible from the outside of the housing 7. Protective panel 11 has an area larger than the display face of liquid crystal display panel 10. Protective panel 11 is supported by housing 7 in a state where protective panel 11 is sandwiched between O ring 12 and sliding plate 13.

O ring 12 is engaged with groove 18 formed in opposite face 16a of first outer case 7a and is arranged along the entire periphery of protective panel 11.

Further, first outer case 7a has engaging depressed portion 20a formed therein, engaging depressed portion 20a having second outer case 7b engaged therewith. Second outer case 7b has engaging protruded portion 20b formed therein, engaging protruded portion 20b being engaged with engaging depressed portion 20a of first outer case 7a. First outer case 7a and second outer case 7b have another O ring 21 interposed between engaging depressed portion 20a and engaging protruded portion 20b, whereby a portion where engaging depressed portion 20a is engaged with engaging protruded portion 20b is airtightly closed.

Figure 4:
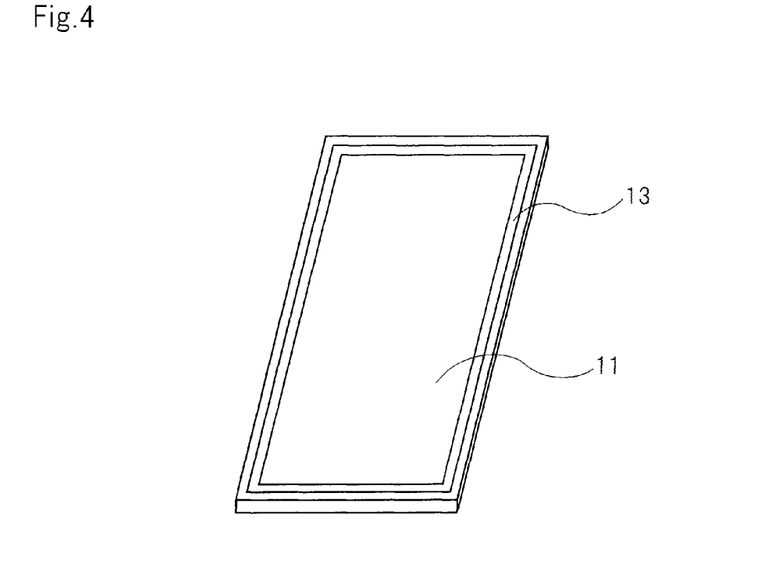
[FIG. 4] A perspective view showing a sliding plate of a waterproof structure in the first embodiment.

A perspective view of sliding plate 13 of waterproof structure 1 in the first embodiment is shown in FIG. 4. Sliding plate 13 is formed of, for example, a resin material such as POM (polyacetal) or a silicon rubber which has an excellent sliding ability. Further, a member made by boding a tape material made of tetrafluoroethylene to a cushion material may be employed as sliding plate 13.

Sliding plate 13, as shown in FIG. 4, is formed in the shape of an annular plate, for example, in the shape of a square frame and is arranged along the entire periphery of protective panel 11 at a position opposite to O ring 12 with respect to protective panel 11. For this reason, opening 8 of housing 7 is airtightly closed by protective panel 11 and O ring 12. Here, when a material having an excellent waterproof properties such as a polymer material is used as sliding plate 11, the waterproof properties can be also further enhanced as required.

First outer case 7a has holding depressed portion 23 formed at a position opposite to an end face of protective panel 11, withholding depressed portion 23 holding spring member 14. Spring member 14 is held in holding depressed portion 23. Spring member 14 is formed of a metal material or a resin material such as elastomer and is provided with elastically deformed piece 14*a* which makes contact with the end face of protective panel 11.

In spring member 14, elastically deformed piece 14*a*, which made contact with the end face of protective panel 11, is elastically deformed to thereby hold protective panel 11 in such a way that protective panel 11 can be displaced in a direction shown by arrow (a), which is parallel to the opening plane of opening 8. Although not shown in the drawing, spring member 14 is arranged along the respective sides of an outer peripheral portion of protective panel 11.

As to waterproof structure 1 in the first embodiment constructed in the manner described above, the movements of protective panel 11 and sliding plate 13 will be described. A section view for illustrating movement of waterproof structure 1 in the first embodiment is shown in FIG. 5.

Figure 5:
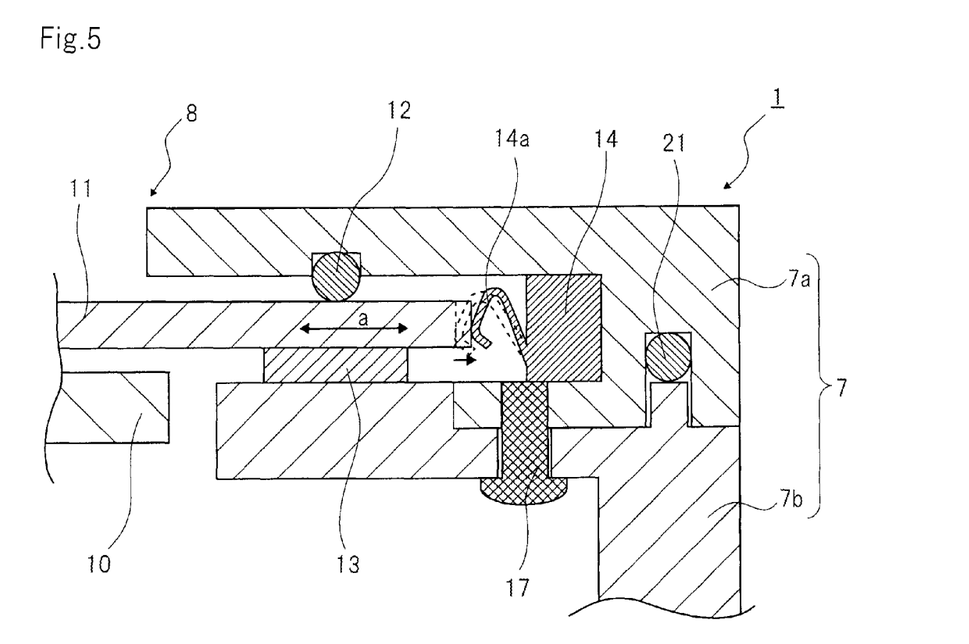
[FIG. 5] A section view illustrating a movement of the waterproof structure in the first embodiment.

As shown in FIG. 5, in the case where protective panel 11 and the housing 7 are changed in an outside dimension by a temperature change of the electronic device, a relative displacement is caused between protective panel 11 and the housing 7. Even in this case, in waterproof structure 1, elastically deformed piece 14*a* of spring member 14 is elastically deformed, whereby the amount of displacement of protective panel 11 and housing 7 can be absorbed and protective panel 11 slides in the state where protective panel 11 is held by sliding plate 13. For this reason, even in the case where protective panel 11 slides in a direction parallel to the opening plane of opening 8, O ring 12 is held sandwiched between first outer case 7*a* and protective panel 11 and hence the airtightness can be held between them, so that the waterproof properties can be sufficiently maintained.

Further, even in the case where an impact is applied to the electronic device from the outside, for example, when the electronic device is dropped, as is the case described above, a relative displacement is caused between protective panel 11 and the housing 7. Even in this case, in waterproof structure 1, elastically deformed piece 14*a* of spring member 14 is elastically deformed, whereby the amount of displacement of protective panel 11 and housing 7 can be absorbed and protective panel 11 slides in the state where protective panel 11 is held by sliding plate 13. Hence, O ring 12 is held sandwiched between protective panel 11, which slides in a direction parallel to the opening plane of opening 8, and first outer case 7*a* and hence the airtightness can be maintained between them, so that the waterproof property can be sufficiently maintained.

As described above, according to waterproof structure 1 which the electronic device of the first embodiment has, protective panel 11 is slidably held by sliding palate 13 and spring member 14 made contact with protective panel 11, so that even in the case where protective panel 11 and case 7 have their outside dimensions changed or have an impact applied thereto, protective panel 11 and case 7 can maintain airtightness. As a result, according to the present embodiment, the electronic device can enhance waterproof properties and can prevent protective panel 11 and housing 7 from being broken by the impact and hence can enhance resistance to impact.

Further, according to the present embodiment, the limitation of linear expansion coefficient of a material to be used for a constituent member can be relaxed and hence freedom to combine materials to be used for the constituent member can be increased, which makes it possible to select a material whose durability is excellent.

Still further, in the present embodiment, the outer peripheral portion of protective panel 11 is held by elastically deformed piece 14*a* of spring member 14 arranged along the respective sides of protective panel 11. For this reason, protective panel 11 can be combined with liquid crystal display panel 10 in such a way that the center of an opposite face of protective panel 11 opposite to liquid crystal display panel 10 is aligned with the center of the display face of liquid crystal display panel 10, which can decrease the occurrence of defects during assembly.

Hereinafter, other embodiments will be described. The other embodiments are identical in the basic construction to the first embodiment, so that the same constituent members as the constituent members in the first embodiment are denoted by the same reference symbols as in the first embodiment and their descriptions will be omitted.

(Second Embodiment)

Figure 6:
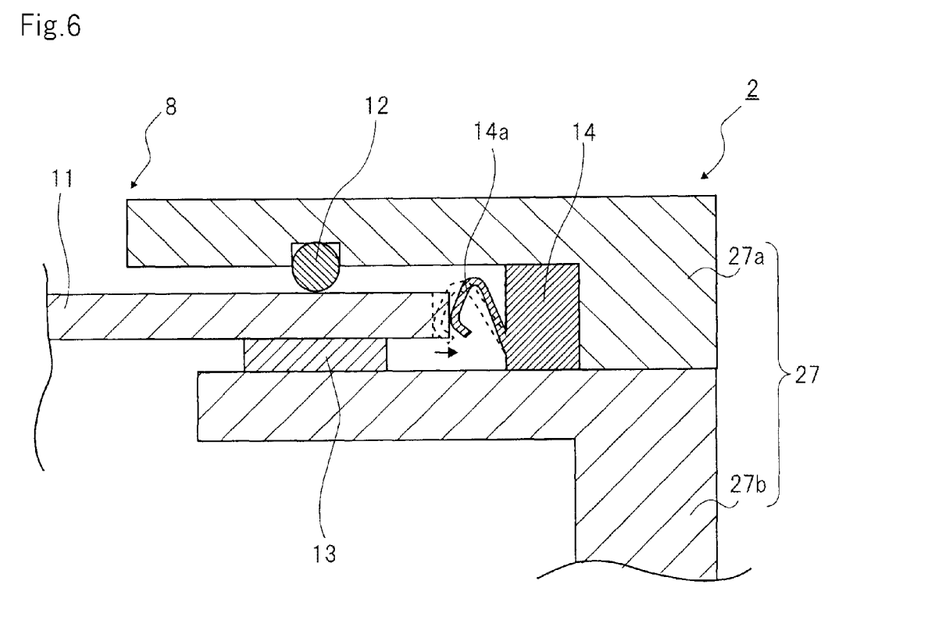
[FIG. 6] A section view showing a waterproof structure according to a second embodiment.

A section view of a waterproof structure in a second embodiment is shown in FIG. 6. The waterproof structure in the second embodiment simplifies the construction of a housing and is different from the first embodiment in that screw 17 and O ring 21 are eliminated, screw 17 combining first outer case 7*a* and second outer case 7*b* which construct housing 7, O ring 21 being interposed between first outer case 7*a* and second outer case 7*b*.

As shown in FIG. 6, waterproof structure 2 in the second embodiment includes housing 27 made by combining first outer case 27*a* and second outer case 27*b*. First outer case 27*a* and second outer case 27*b* are bonded to each other by use of, for example, an adhesive. Further, first outer case 27*a* and second outer case 27*b* may be welded to each other in place of using the adhesive, thereby being bonded to each other.

Further, the present embodiment, as shown in FIG. 6, may be constructed in such a way that a constituent part such as a liquid crystal display panel is not arranged at a position corresponding to opening 8 and, as is the case with the first embodiment described above, of course, may be constructed in such a way that the liquid crystal display panel and other kinds of constituent parts are arranged at a position corresponding to opening 8 of housing 7.

Also in the present embodiment, as is the case with the first embodiment, waterproof properties and the resistance to impact can be enhanced. In addition, according to the second embodiment, as compared with the first embodiment, O ring 21 is eliminated, so that the shape of first outer case 27*a* and second outer case 27*b* can be simplified and hence the construction can be simplified.

(Third Embodiment)

Figure 7:
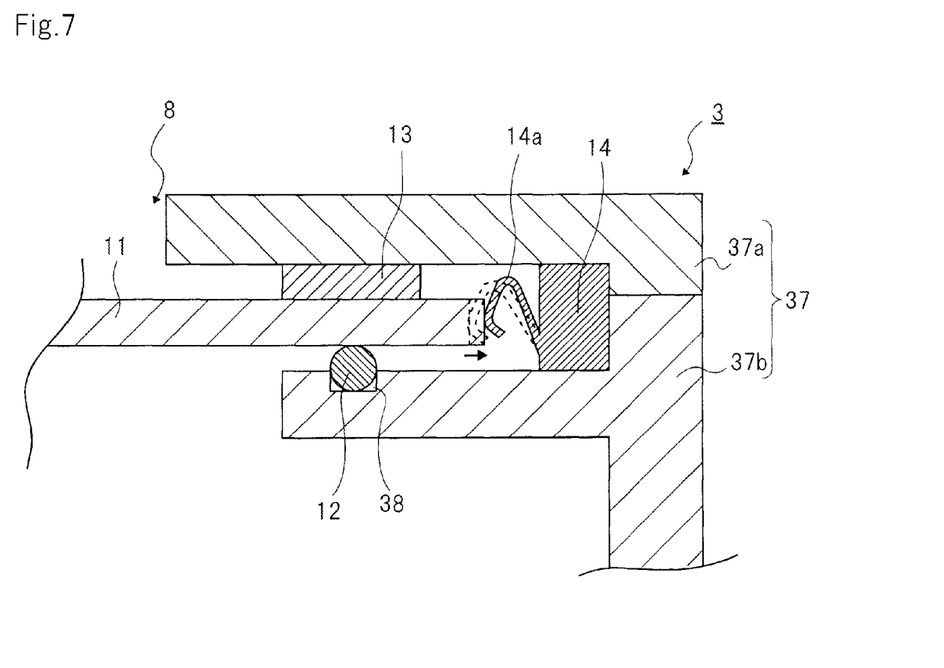
[FIG. 7] A section view showing a waterproof structure according to a third embodiment.

A section view of a waterproof structure in a third embodiment is shown in FIG. 7. The waterproof structure in the third embodiment is different from the second embodiment in that:_protective panel 11 is interposed in housing 37;_sliding plate 13 is arranged on the outer side of housing 37; and O ring 12 is arranged on the inner side of housing 37. In other words, the arrangement of sliding plate 13 and O ring 12 in the third embodiment are opposite to those in the second embodiment.

As shown in FIG. 7, waterproof structure 3 in the third embodiment includes housing 37 which is made by combining first outer case 37*a* with second outer case 37*b*. Sliding plate 13 is arranged in such a way as to make contact with an outer face of protective panel 11 which is arranged in opening 8. Second outer case 37*b* has groove 38 formed therein, groove 38 having O ring 12 engaged therewith. O ring 12 is arranged in such a way as to make contact with an inner face of protective panel 11 arranged in opening 8.

Also in the present embodiment, as is the case with the first embodiment, the waterproof properties and resistance to impact can be enhanced. In addition, in the third embodiment, by changing the arrangements of sliding plate 13 and O ring 12 as required, the freedom of fabrication of the electronic device can be enhanced.

(Fourth Embodiment)

Figure 8:
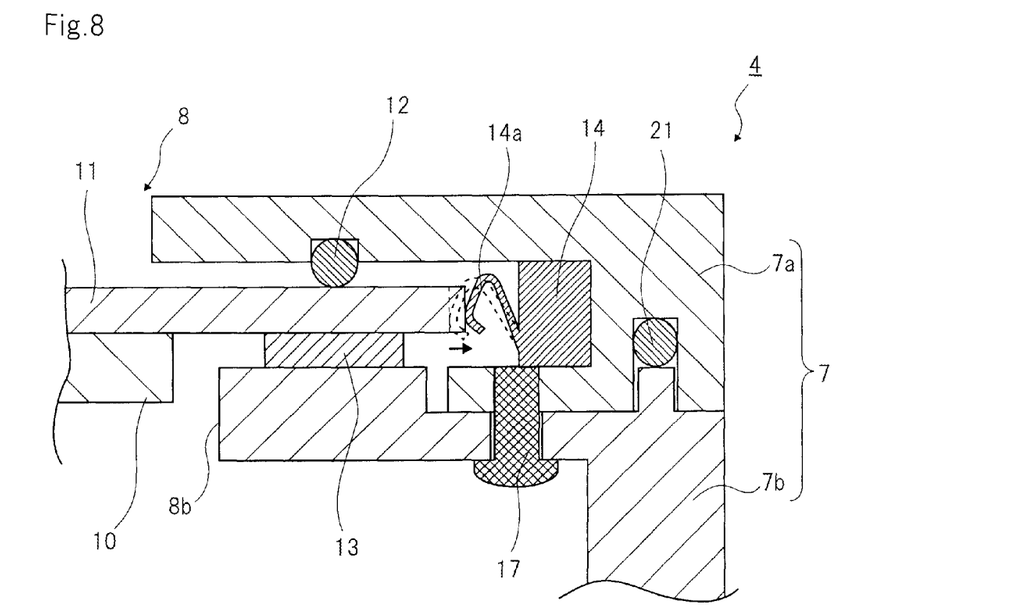
[FIG. 8] A section view showing a waterproof structure according to a fourth embodiment.

A section view of a waterproof structure in a fourth embodiment is shown in FIG. 8. The waterproof structure in the fourth embodiment is different from the first embodiment in that the liquid display panel is fixed to a protective panel.

As shown in FIG. 8, in waterproof structure 4 in the fourth embodiment, the periphery of the display face of liquid crystal display panel 10 is bonded to protective panel 11 by the use of an adhesive (not shown) and liquid crystal display panel 10 is fixed to an inner face of protective panel 11. Further, a given clearance is formed between the outer peripheral portion of liquid crystal display panel 10 and opening 8$b$ of second outer case 7$b$, so that waterproof structure 4 is constructed in such a way that liquid crystal display panel 10 moving along with protective panel 11 does not make contact with opening 8$b$ of second outer case 7$b$.

In the present embodiment, protective panel 11 and liquid crystal display panel 10 are integrally moved, protective panel 11 being slidably held in a direction parallel to the opening plane of opening 8 by sliding plate 13 and spring member 14. At this time, a given clearance is formed so as to prevent liquid crystal display panel 10 that moved together with protective panel 11 from making contact with opening 8$b$ of second outer case 7$b$, whereby liquid crystal display panel 10 is prevented from being broken by an impact. For this reason, by positioning and fixing liquid crystal display panel 10 with respect to protective panel 11, the relative position of protective panel 11 to liquid crystal display panel 10 can be determined with high accuracy.

Also in the present embodiment, as is the case with the first embodiment, the waterproof property and the resistance to impact can be enhanced. In addition, in the fourth embodiment, the given clearance is formed between liquid crystal display panel 10 fixed to protective panel 11 and opening 8$b$ of second outer case 7$b$, whereby liquid crystal display panel 10 can be prevented from being broken by an impact. Further, according to the fourth embodiment, it is possible to prevent a problem such that, as compared with the first embodiment, a relative shift in position is caused between protective panel 11 and liquid crystal display panel 10 in the manufacturing process.

(Fifth Embodiment)

Figure 9:
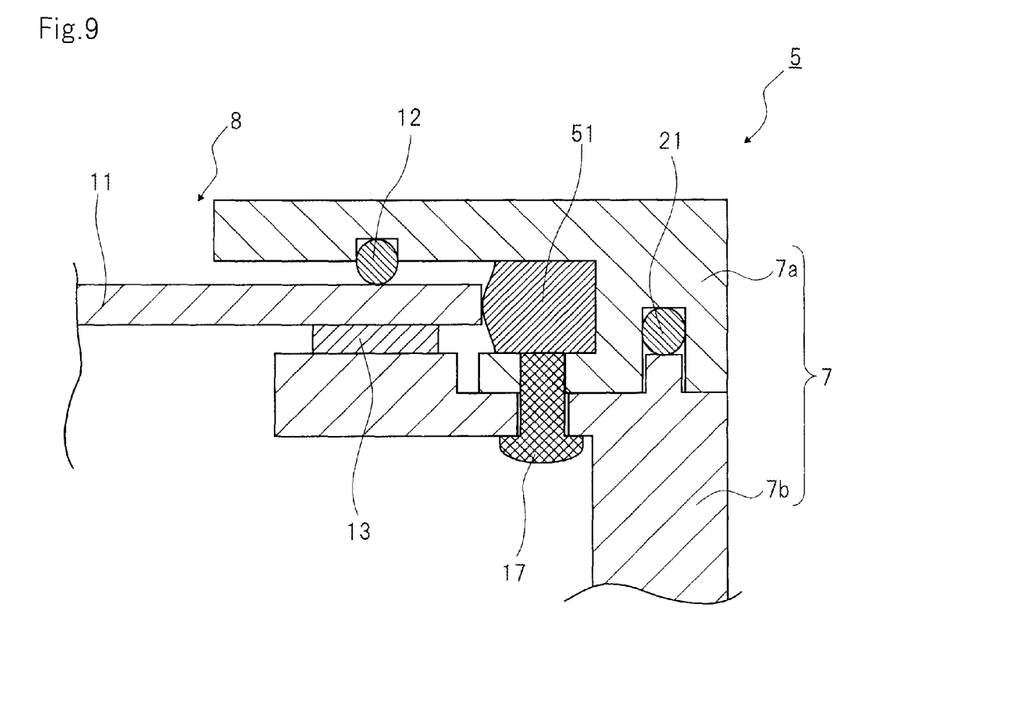
[FIG. 9] A section view showing a waterproof structure according to a fifth embodiment.

A section view of a waterproof structure in a fifth embodiment is shown in FIG. 9. The waterproof structure in the fifth embodiment is different from the first embodiment in that a bumper member made of an elastic material is disposed in place of spring member 14.

As shown in FIG. 9, in waterproof structure 5 in the fifth embodiment, bumper member 51 is disposed in holding depressed portion 23 of housing 7 in such a way that one end of bumper member 51 makes contact with an end face of protective panel 11. Bumper member 51 is formed of, for example, elastomer in the shape of a square frame and protective panel 11 is fitted in and held by an inner peripheral portion of the square frame of bumper member 51.

Also in the present embodiment, as is the case with the first embodiment, waterproof properties and resistance to impact can be enhanced. In addition, according to the fifth embodiment, it is possible to eliminate a part likely to be buckled such as elastically deformed piece 14$a$ by the use of bumper member 51. Hence, it is possible to enhance the reliability of the movement of protective panel 11 and housing 7 in such a way that protective panel 11 and housing 7 can be displaced.

Here, the waterproof structure according to the present invention can be desirably applied to an electronic device having a display panel, for example, a portable music player, a portable television, and a portable disk player. Further, the present invention is not limited to the portable electronic device described above but, of course, can be suitably applied to other electronic devices, for example, a notebook type personal computer (PC), a desktop type PC, a camera, and a watch.

Up to this point, the invention of the present application has been described with reference to the embodiments. However, the invention of the present application is not limited to the embodiments described above, but various modifications that can be understood by those skilled in the art can be made for the construction and details of the invention of the present application within the scope of the invention of the present application.

This application is based upon and claims the benefit of priority from Japanese Patent Application No. 2011-047738, filed on Mar. 4, 2011, the disclosure of which is incorporated herein in its entirety by reference.

DESCRIPTION OF REFERENCE NUMERALS AND SIGNS

1—waterproof structure
7—housing
7$a$—first outer case
7$b$—second outer case
8 (8$a$, 8$b$)—opening
11—protective panel
12—O ring
13—sliding plate
14—spring member

The invention claimed is:

1. A waterproof structure comprising:
a housing which has an opening;
a closing member which is arranged in the housing and which closes the opening;
a waterproof member which is arranged on one face of the closing member in a direction perpendicular to an opening plane of the opening;
a holding member which is arranged on the other face of the closing member in a direction perpendicular to the opening plane of the opening and which holds the closing member in such a way that the closing member can slide in a direction parallel to the opening plane of the opening; and
an elastic member which is arranged such that the elastic member makes contact with an end portion of the closing member and which supports the closing member in such a way that the closing member can be displaced in a direction parallel to the opening plane of the opening,
wherein the closing member is supported by the housing in a state in which the closing member is sandwiched between the waterproof member and the holding member.

2. The waterproof structure according to claim 1, comprising:
a display element whose display face is arranged opposite to the closing member.

3. The waterproof structure according to claim 2,
wherein the display element is fixed to the closing member.

4. The waterproof structure according to claim 3,
wherein the elastic member has an elastically deformed piece which makes contact with an end portion of the closing member.

5. An electronic device comprising the waterproof structure as claimed in claim 3.

6. The waterproof structure according to claim 2, wherein the holding member is disposed in an annular shape along an entire periphery of the closing member.

7. The waterproof structure according to claim 2, wherein the housing has a first outer case which is arranged on one face side of the closing member in a direction perpendicular to the opening plane of the opening, and has a second outer case, which is arranged on the other face side of the closing member in a direction perpendicular to the opening plane of the opening, and
wherein the housing has another waterproof member which is arranged between the first outer case and the second outer case.

8. The waterproof structure according to claim 2, wherein the elastic member has an elastically deformed piece which makes contact with an end portion of the closing member.

9. An electronic device comprising the waterproof structure as claimed in claim 2.

10. The waterproof structure according to claim 1, wherein the holding member is disposed in an annular shape along an entire periphery of the closing member.

11. The waterproof structure according to claim 10, wherein the elastic member has an elastically deformed piece which makes contact with an end portion of the closing member.

12. The waterproof structure according to claim 1, wherein the housing has a first outer case which is arranged on one face side of the closing member in a direction perpendicular to the opening plane of the opening, and has a second outer case, which is arranged on the other face side of the closing member in a direction perpendicular to the opening plane of the opening, and
wherein the housing has another waterproof member which is arranged between the first outer case and the second outer case.

13. The waterproof structure according to claim 12, wherein the elastic member has an elastically deformed piece which makes contact with an end portion of the closing member.

14. The waterproof structure according to claim 1, wherein the elastic member has an elastically deformed piece which makes contact with an end portion of the closing member.

15. An electronic device comprising the waterproof structure as claimed in claim 1.

16. The waterproof structure according to claim 1, wherein the holding member holds the closing member in such a way that the closing member can slide in the direction parallel to the opening plane of the opening thereby providing relative displacement between the housing and the closing member with the closing member sliding in a state in which the closing member is sandwiched between the waterproof member and the holding member with an airtightness being maintained between the housing and the closing member.

17. The waterproof structure according to claim 1, wherein the holding member holds the closing member in such a way that the closing member can slide in the direction parallel to the opening plane of the opening thereby providing relative displacement between the housing and the closing member with the opening being airtightly closed by the waterproof member and the closing member.

18. The waterproof structure according to claim 1, wherein the holding member hold the closing member in such a way that the closing member can slide in the direction parallel to the opening plane of the opening thereby providing relative displacement between the housing and the closing member with the closing member sliding in a state with an airtightness being maintained between the housing and the closing member in which the closing member is sandwiched between the waterproof member and the holding member.

19. A method for manufacturing a waterproof structure, the method comprising the steps of:
sandwiching a closing member, which is arranged in a housing and which closes an opening of the housing, between a waterproof member, which is arranged on one face of the closing member in a direction perpendicular to an opening plane of the opening, and a holding member, which is arranged on the other face of the closing member in a direction perpendicular to the opening plane of the opening; and
holding the closing member by an elastic member, which makes contact with an end portion of the closing member in such a way that the closing member can be displaced in a direction parallel to the opening plane of the opening.

20. The method of claim 19, wherein the holding member holds the closing member in such a way that the displacement in the direction parallel to the opening plane of the opening provides relative displacement between the housing and the closing member with the closing member sliding in a state in which the closing member is sandwiched between the waterproof member and the holding member with an airtightness being maintained between the housing and the closing member.

* * * * *